US007952197B2

(12) United States Patent
Stoehr et al.

(10) Patent No.: US 7,952,197 B2
(45) Date of Patent: May 31, 2011

(54) ELECTRICAL COMPONENT

(75) Inventors: Peter Stoehr, Munich (DE); Patric Heide, Vaterstetten (DE); Johann Heyen, Munich (DE); Kostyantyn Markov, Munich (DE)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 12/503,651

(22) Filed: Jul. 15, 2009

(65) Prior Publication Data

US 2009/0321917 A1    Dec. 31, 2009

Related U.S. Application Data

(63) Continuation of application No. PCT/DE2008/000065, filed on Jan. 16, 2008.

(30) Foreign Application Priority Data

Jan. 22, 2007    (DE) .......................... 10 2007 003 182

(51) Int. Cl.
*H01L 23/34*    (2006.01)
*H01L 23/48*    (2006.01)

(52) U.S. Cl. ........ 257/728; 257/701; 257/723; 257/774; 257/E23.062

(58) Field of Classification Search .................. 257/701, 257/723, 774, 728, E23.062
See application file for complete search history.

(56) References Cited

U.S. PATENT DOCUMENTS

| | | | |
|---|---|---|---|
| 4,322,778 A * | 3/1982 | Barbour et al. | 361/794 |
| 4,739,448 A * | 4/1988 | Rowe et al. | 361/719 |
| 5,352,632 A | 10/1994 | Sawaya | |
| 5,717,249 A | 2/1998 | Yoshikawa et al. | |
| 5,780,926 A | 7/1998 | Seo | |
| 6,627,992 B2 * | 9/2003 | Ammar | 257/728 |
| 6,724,278 B1 | 4/2004 | Smith | |
| 7,116,952 B2 | 10/2006 | Arafa | |
| 7,547,929 B2 * | 6/2009 | Tanaka et al. | 257/197 |

(Continued)

FOREIGN PATENT DOCUMENTS

DE    10 2005 020 086 A1    11/2006

(Continued)

OTHER PUBLICATIONS

Chernyakov, A., et al., "Miniature Fully-integrated WLAN Fronted-Modules based on LTCC Technology," Radio and Wireless Conference, 2004, pp. 139-142, IEEE.

(Continued)

*Primary Examiner* — Nitin Parekh
(74) *Attorney, Agent, or Firm* — Slater & Matsil, L.L.P.

(57) ABSTRACT

The invention discloses an electrical component with a carrier substrate, on which at least one semiconductor chip is mounted. Terminal areas are arranged on the underside of the carrier substrate and contact areas designed for the assembly with semiconductor chips are arranged on the upper side. The carrier substrate has a functional area that is divided into sections, wherein each section is assigned at least one function such as, e.g., as a filter, a frequency-separating filter, a balun, etc. A separate area of the carrier substrate is assigned to each section. The following applies to at least one of the sections: the contact area and/or the terminal area that is conductively connected to the section lies outside the base of this section. The connecting line that conductively connects the input or output of the respective section to the contact area and/or the terminal area is preferably shielded from the section by a ground area.

21 Claims, 4 Drawing Sheets

U.S. PATENT DOCUMENTS

| | | |
|---|---|---|
| 2002/0049042 A1 | 4/2002 | Oida et al. |
| 2002/0171141 A1* | 11/2002 | Ammar .......................... 257/728 |
| 2003/0020173 A1* | 1/2003 | Huff et al. ...................... 257/774 |
| 2004/0033673 A1 | 2/2004 | Cobbley et al. |
| 2004/0036165 A1* | 2/2004 | Ammar .......................... 257/723 |
| 2005/0048695 A1 | 3/2005 | Chia et al. |
| 2005/0109535 A1 | 5/2005 | Audet et al. |
| 2005/0121770 A1 | 6/2005 | Baek et al. |
| 2005/0194674 A1 | 9/2005 | Thomas et al. |
| 2005/0206010 A1 | 9/2005 | Noquil et al. |
| 2006/0057772 A1 | 3/2006 | Huang |
| 2006/0229035 A1 | 10/2006 | Fukamachi et al. |
| 2008/0186106 A1 | 8/2008 | Christian et al. |
| 2008/0212283 A1 | 9/2008 | Chernyakov et al. |

FOREIGN PATENT DOCUMENTS

EP        0 455 245 A2     11/1991

OTHER PUBLICATIONS

Chernyakov, A., et al., "Novel Small-Size LTCC-Based WLAN Frontend-Modules with Integrated Power Amplifiers," Microwave Symposium Digest, 2004, pp. 559-562, IEEE MTT-S International.

Heide, P., et al., "Ultracompact front-end modules for WLANs," EPCOS Components, Jan. 2004, pp. 32-36.

* cited by examiner

ELECTRICAL COMPONENT

This application is a continuation of co-pending International Application No. PCT/DE2008/000065, filed Jan. 16, 2008, which designated the United States and was not published in English, and which claims priority to German Application No. 10 2007 003 182.5 filed Jan. 22, 2007, both of which applications are incorporated herein by reference.

BACKGROUND

U.S. Patent Application Publication No. 2006/0229035 A1 discloses a circuit arrangement that realizes a front-end module of a transceiver unit.

SUMMARY

In one aspect, the present invention discloses an electrical component that has low space requirements and provides flexibility with respect to its design.

According to a first preferred embodiment, an electrical component with a carrier substrate on which at least one semiconductor chip is mounted is disclosed. Terminal areas of the component are arranged on the underside of the carrier substrate, and contact areas are arranged on the upper side of the carrier substrate. The contact areas are designed to be assembled with semiconductor chips and, if applicable, other chips that include filter chips, chip inductors and chip capacitors, and are arranged in an assembly plane. The chips are preferably realized in the form of SMD (Surface Mounted Device) components.

The terminal areas are arranged in a footprint plane. The layout of the terminal areas is referred to as a footprint.

The functional area represents a spatial area, i.e., a three-dimensional area. Each section represents a spatial subarea of the functional area.

The carrier substrate has a functional area with at least one section, wherein at least one function such as, e.g., for a filter, a coupler, a frequency-separating filter, a balun, heat dissipation for the semiconductor chip, etc., is assigned to each section. Not all cited functions need to be realized in the functional area of the carrier substrate, wherein a few of these functions may be realized in at least one chip that is mounted on the carrier substrate.

The sections are selectively connected electrically to one another, to the contact areas, or to the terminal areas. The sections may be electrically connected to one another in any combination. The sections are arranged within the functional area of the substrate in such a way that advantageous electrical, mechanical and thermal properties of the component can be achieved. For example, it is considered advantageous to realize the heat dissipation section in a central area of the substrate between other sections.

In one advantageous variant, the sections are arranged adjacent to one another relative to the base of the carrier substrate.

This makes it possible to realize a particularly compact layout of the functional area. The optimization of the layout made it possible, for example, to reduce the base of a component of identical height from 64 mm² to 24 mm².

In the equivalent circuit diagram, each function, e.g., the function of a frequency-separating filter, a filter, a balun, a heat dissipation for the chip supply lines, is fulfilled by a functional block that preferably features passive circuit elements, e.g., inductors, capacitors, coupled and non-coupled line sections. At least some of these circuit elements are preferably integrated into the carrier substrate.

The term balun or balanced-to-unbalanced transformer refers to a transformer that represents an interface between an unbalanced and a balanced terminal pair. These transformers and/or balanced filters (in one variation, transformer and filter) adapt "single-ended" connections of the amplifiers to "balanced" inputs and outputs of a transceiver circuit. In one advantageous variant, the transceiver circuit is realized in the form of a WLAN (Wireless Local Area Network) transceiver IC.

The respective functional block according to the equivalent circuit diagram preferably is completely realized in the section assigned thereto. However, it would also be possible to realize at least one circuit element of the functional block, e.g., in the form of a chip to be mounted on the carrier substrate.

The circuit elements of the functional block that are realized in the form of a chip may comprise, e.g., at least one chip capacitor, at least one chip inductor and/or at least one diode.

In addition to the above-described sections, the functional area may feature a section in which an arrangement of supply lines leading to the semiconductor chip is accommodated. The arrangement of supply lines is realized such that the supply lines extend adjacent to one another and form a compact supply line block. The supply line block may comprise supply lines designed for carrying a high-frequency signal. It may also comprise supply lines and control lines that are designed for supplying power and/or for controlling the semiconductor chip.

It is possible to realize at least two of the aforementioned functions in one and the same section. It is also possible to realize at least one of the aforementioned functions and one other function in one and the same section.

The following applies to at least one of the sections: the contact area and/or the terminal area that is conductively connected to the section lies outside the base of this section. The connecting line that conductively connects the input and the output of the respective section to the contact area and/or the terminal area is preferably shielded from the section by a ground area.

The ground areas contain recesses that are preferably realized in the form of openings, through which the electrical lines extend. These lines are electrically insulated relative to ground. The arrangement of connecting lines and shields between the aforementioned sections is referred to as a rewiring plane or section or a redistribution layer.

Despite a predetermined spatial arrangement of external electrical connections of the sections, one is no longer dependent on the spatial arrangement of the sections due to the redistribution layer. This allows a flexible and space-saving design of the component, in which the available space is optimally utilized.

The spatial division of the functional area into separate sections according to the functional blocks in the equivalent circuit diagram provides the advantage of minimizing the crosstalk between the functional blocks.

At least two of the sections can be arranged adjacent to one another. At least two of the sections can be arranged one on top of the other. In one variant, a first area of a first section is arranged adjacent to a second section and a fourth area of the first section is arranged above or underneath the second section.

Advantageous implementations of the component are described below.

The at least one semiconductor chip preferably comprises amplifiers and semiconductor switches. The amplifiers comprise power amplifiers and low-noise amplifiers. The at least one semiconductor chip may comprise a directional coupler with an HR detector. The HR detector comprises at least one detector diode.

The component preferably represents a front-end module that can be used in mobile communication devices. The front-end module is preferably designed for at least two frequency bands, i.e., for several transmission systems.

The carrier substrate preferably comprises a ceramic base body that features internal metallization planes. In this case, each of these metallization planes is arranged between two ceramic layers and comprises electrically conductive structures such as, e.g., strip conductors and electrically conductive areas. The metallization planes are conductively connected to one another by means of through-platings that are arranged in the ceramic layers.

Particularly suitable ceramic materials for the carrier substrate are LTCC (Low Temperature Cofired Ceramics) ceramics.

In one variant, the number of ceramic layers lies between 6 and 20, wherein the typical layer thickness of a ceramic layer lies between 35 and 150 μm. The permittivity preferably lies in the range between 5 and 200.

Long, stretched-out and, if applicable, folded strip conductors arranged in the metallization planes are suitable for realizing an inductor, a phase shifter or a connecting line. Conductive areas that are respectively arranged one on top of the other or in different metallization planes are suitable for realizing a capacitor. Even the through-platings can be used for realizing a circuit element, preferably an inductor. These circuit elements make it possible to realize the respective functional block according to the equivalent circuit diagram as an integrated function.

The frequency-separating filter is preferably realized in the form of a frequency-separating filter section of the functional area. Alternatively, it would be possible to realize the frequency-separating filter in at least one chip that is mounted on the carrier substrate. It is also possible to realize the baluns in a section or in at least one chip.

The filters comprise transmission filters arranged in transmitting paths and reception filters arranged in receiving paths. All transmission filters and reception filters are preferably realized in a filter section of the functional area. Alternatively, all transmission filters may be realized in a transmission filter section and all reception filters may be realized in a separate reception filter section. According to another alternative, at least some of the filters, particularly the filters realized in the form of bandpass filters, could be realized in at least one chip that is mounted on the carrier substrate.

The area of the carrier substrate that is assigned to a certain section does not overlap the areas assigned to other sections. The sections are spatially separated from one another or realized independently everywhere. This means that a separate area of the carrier substrate is assigned to each section.

An insulation zone with a width of at least 100 μm is preferably provided between at least two of the sections. With the exception of the connecting lines extending through the insulation zone, the insulation zone features no electrically conductive structures.

The insulation zone preferably has a maximum width of 300 μm. Here, the sections are preferably electrically connected to one another by a connecting line with a maximum length of 500 μm. The length of the connecting line is measured on both sides between locations at which it respectively runs into a conductive area.

In one advantageous variant, the carrier substrate features an upper wiring area and a lower wiring area. Both wiring areas are spatially separated from the functional area. The functional area is preferably arranged between the wiring areas.

The upper wiring area features first connecting lines that conductively connect the sections to the contact areas. The lower wiring area features second connecting lines that conductively connect the sections to the terminal areas. At least one of the first and/or second connecting lines extends beyond the base of the section connected thereto.

The function of a wiring area consists of producing an electrical connection between at least a first pad and at least a second pad, if these pads are spaced apart from one another in the lateral plane such that no direct vertical electrical connection can be realized. The first pads consist of the input or the output of the respective section. The second pads consist of contact areas and terminal areas.

The upper wiring area represents an interface of sorts between the functional area and the assembly plane of the carrier substrate with the contact areas. The lower wiring area represents an interface of sorts between the functional area and the footprint of the carrier substrate.

One particular advantage can be seen in that not only one wiring area, e.g., toward the footprint, is provided in the carrier substrate, but rather two wiring areas for the adaptation to the footprint, as well as for the adaptation to the assembly plane. The wiring areas allow arbitrarily flexible wiring between the functional area and the external electrical contacts of the carrier substrate that are arranged on the underside, as well as on the upper side.

The two wiring areas and the functional area are preferably manufactured with one technology and in one body, wherein these areas are sintered jointly wherein ceramic bodies are used. They are not connected to one another, in particular, by means of bonding, but rather monolithically.

The functional area of the carrier substrate is preferably shielded relative to the upper and lower wiring areas by means of one respective ground area that extends over at least two of the sections. The upper and/or lower ground area preferably extends over all sections.

Heat dissipation is preferably provided for cooling the power amplifiers, but may also be used for cooling the semiconductor switches. The supply lines leading to the semiconductor chip are preferably provided for wiring the amplifiers, but may also be used for wiring the semiconductor switches.

In one advantageous variant, the functional area comprises a frequency-separating filter section, a balun section, a filter section and an amplifier section, in which the heat dissipation of the amplifiers and the electric wiring of the amplifiers are accommodated. The heat dissipation is preferably realized in the form of an arrangement of through-platings, wherein the through-platings are realized in the form of vertical, electrically conductive columns.

In one variant, the amplifier section also comprises the heat dissipation for the switches that is realized essentially identical to that of the amplifiers. The amplifier section may also comprise the electric wiring of the switches. Alternatively, it would also be possible to realize the heat dissipation and the wiring of the switches in a separate section.

It is possible to realize the heat dissipation of the amplifiers and/or switches in a heat dissipation section, while the wiring of the amplifiers and/or switches is realized in a respectively separate section or in a common wiring section.

The supply lines and the heat dissipation of the power amplifiers, the low-noise amplifiers and the switches may be realized in one common section. However, the supply lines of the low-noise amplifiers may also be realized in a separate section.

The balun section may, in principle, form part of the filter section, e.g., if the filters respectively feature a balanced and an unbalanced terminal pair. At least the amplifier section and the frequency-separating filter section and/or the amplifier section and the filter section are spatially separated from one another.

In one variant, the component features a first signal path that comprises a first transmitting path and a first receiving path and is assigned to the first transmission system. The component also features a second signal path that comprises a second transmitting path and a second receiving path and is assigned to the second transmission system. The frequency bands of the transmission systems differ by at least one octave. The first frequency band lies, e.g., at 2.4 GHz and the second frequency band lies at 5 GHz.

The frequency-separating filter is preferably realized in the form of a diplexer for separating signals of the first and the second transmission system.

In another variant, the frequency-separating filter may be realized in the form of a duplexer that is provided for separating transmission and reception signals of one and the same transmission system.

The frequency-separating filter preferably comprises two filters, for example, a low-pass filter and a high-pass filter. In another variant, the frequency-separating filter has two bandpass filters with different passbands.

In one preferred variant, the frequency-separating filter comprises a first bandpass filter, the passband of which comprises the frequency band of the first transmission system, wherein the frequency band of the second transmission system lies in the stop band of the first bandpass filter. The frequency-separating filter furthermore comprises a second bandpass filter, the passband of which comprises the frequency band of the second transmission system, wherein the frequency band of the first transmission lies in the stop band of the second bandpass filter.

The amplifiers feature a first low-noise amplifier that is arranged in the first receiving path and a second low-noise amplifier that is arranged in the second receiving path. The amplifiers furthermore feature a first power amplifier that is arranged in the first transmitting path and a second power amplifier that is arranged in the second transmitting path.

A first switch that alternately connects the first transmitting path and the first receiving path to a common first transmission-reception path is preferably arranged in the first signal path. A second switch that alternately connects the second transmitting path and the second receiving path to a common second transmission-reception path is arranged in the second signal path.

Depending on the transmission system, the first and the second switch may, in principle, be replaced with a duplexer if the transmission and the reception are carried out in different frequency bands.

The first and the second signal path are preferably connected to the frequency-separating filter, wherein the frequency-separating filter is arranged between an antenna connection of the component and the signal paths. The frequency-separating filter is arranged between the antenna and the switches. An isolating capacitor for suppressing the DC component of the signal may be arranged between the antenna and the frequency-separating filter.

The first switch is arranged between the frequency-separating filter and the first low-noise amplifier. The first switch is arranged between the frequency-separating filter and the first power amplifier. The second switch is arranged between the frequency-separating filter and the second low-noise amplifier. The second switch is arranged between the frequency-separating filter and the second power amplifier.

The respective amplifier is preferably arranged between the respective switch and a filter.

The filters that are arranged in the transmitting paths may be realized in the form of low-pass filters. However, they may also be realized in the form of bandpass filters. The filters that are arranged in the receiving paths are preferably realized in the form of bandpass filters.

The filters are preferably realized in a filter section of the carrier substrate, i.e., integrated into the carrier substrate. It would be possible to realize at least one of the filters in the form of a chip that is mounted on the carrier substrate.

The arrangement of the switches in the immediate vicinity of the amplifiers makes it possible to realize the switches and at least a few of the amplifiers in a single chip. In one variant, the at least one semiconductor chip is realized in the form of a chip that comprises the switches and at least a few of the amplifiers. The switches and the low-noise amplifiers of both signal paths are realized in a common first chip in one variant. The power amplifiers of both signal paths may be realized in a common second chip. In another variant, the switches and the power amplifiers of both signal paths are realized in a common chip. In one advantageous variant, all power amplifiers, low-noise amplifiers and switches are realized in a common semiconductor chip.

The semiconductor chips feature at least one chip that may be cased. The semiconductor chips may also feature at least one bare die, i.e., an uncased chip. The chip may be electrically connected to the contact areas of the carrier substrate by means of bond wires. The chip may also be mounted on the carrier substrate in accordance with the flip-chip technology. In this case, the contact areas of the chip and of the substrate face one another and are connected by means of bumps.

The component is preferably realized in the form of a compact structural unit. The component is preferably suitable for being surface-mounted, i.e., its terminal areas represent SMD contacts.

According to a second preferred embodiment, an electrical component with two signal paths is proposed, wherein a semiconductor switch and a low-noise amplifier electrically connected thereto are arranged in each signal path. The amplifiers and the switches are realized in a common semiconductor chip.

The component preferably features a frequency-separating filter, to which an antenna and the signal paths are connected. However, this frequency-separating filter may, in principle, also be replaced with another switch and/or filter, if applicable. The component according to the second preferred embodiment may feature any combination of the above-described characteristics of the component according to the first preferred embodiment.

The disclosed component is not restricted to the described system architecture of the front-end module.

BRIEF DESCRIPTION OF THE DRAWINGS

The disclosed component and its advantageous implementations are described below with reference to schematic drawings that are not true to scale. In these drawings.

Figure 1:
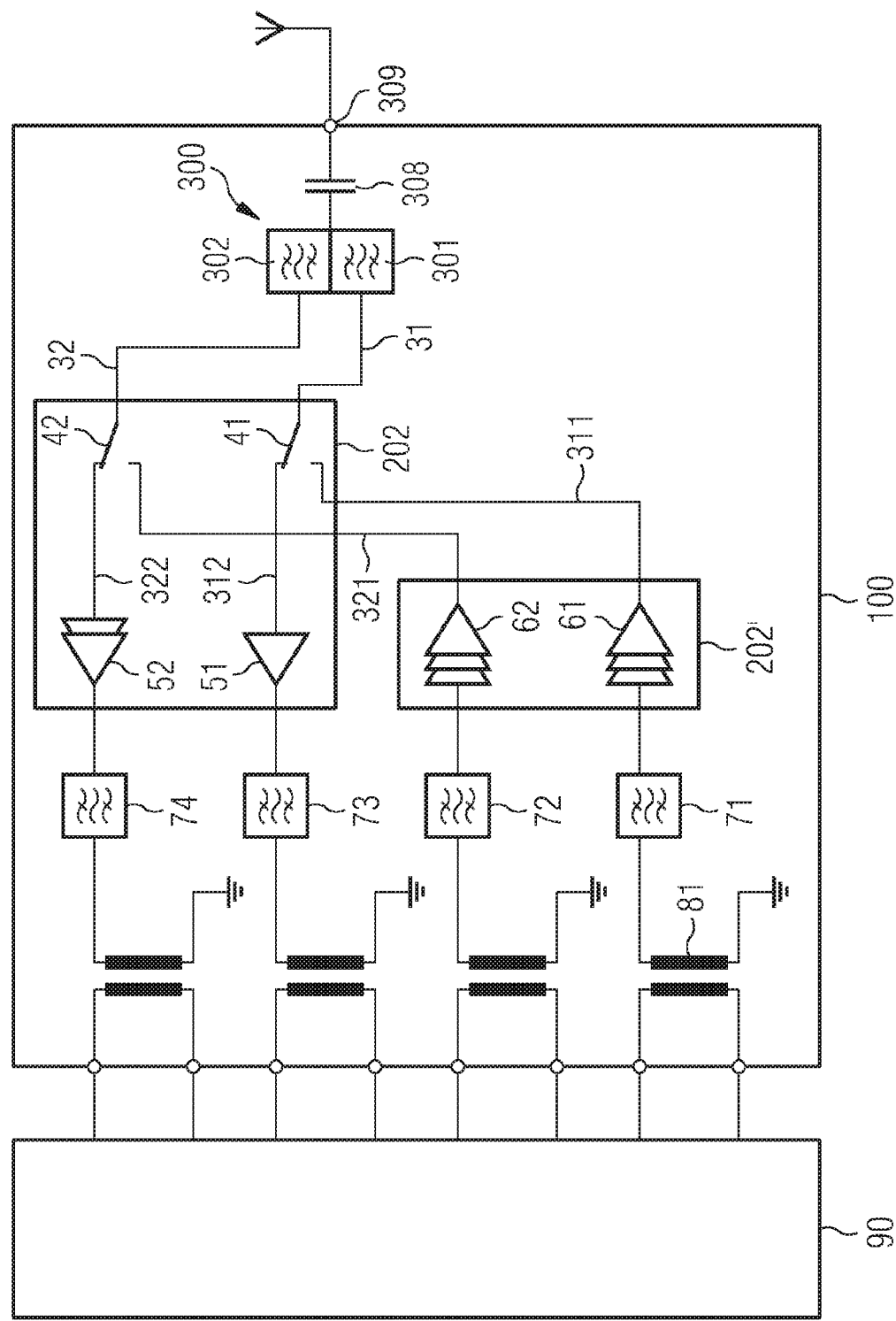
FIG. 1 shows a block diagram of a front-end module comprising the disclosed component.

The following list of reference symbols may be used in conjunction with the drawings:

100 Carrier substrate
101 Lower wiring area
102 Functional area of carrier substrate
103 Upper wiring area
104, 105, 109 Ground area
106 Footprint
107 Assembly plane
111, 112, 113 Section of functional area
114, 115, 116 Section of functional area
125, 126 Recess in ground area 104, 105
131, 132 Connecting line
133 Through-plating column for heat dissipation
135 Amplifier supply line
141 Terminal areas of component
142 Contact area for assembling the chip
152 Ground area arranged underneath the chip 202
152' Ground area arranged underneath the chip 202'
201, 202, 202' Chips
203 Chip
204 Sealing compound
300 Frequency-separating filter (diplexer)
301 First filter of frequency-separating filter
302 Second filter of frequency-separating filter
308 Capacitor
309 Antenna connection
31 First signal path
311 First transmitting path
312 First receiving path
32 Second signal path
321 Second transmitting path
322 Second receiving path
41, 42 Switch
51, 52 Low-noise amplifier
61, 62 Power amplifier
71, 72, 73, 74 Filter
81 Balun
90 Transceiver IC

DETAILED DESCRIPTION OF ILLUSTRATIVE EMBODIMENTS

FIG. 1 shows a front-end module in the form of an equivalent circuit diagram. This front-end module is realized in a component that is described below with reference to the other figures.

The front-end module has an antenna connection 309, to which is connected an antenna that is used for transmission, as well as for reception.

The front-end module preferably forms an interface between the antenna and the transceiver circuit of a WLAN system.

The front-end module comprises a frequency-separating filter 300 that is connected to the antenna connection 309 via the isolating capacitor 308. The frequency-separating filter 300 features a first filter 301 and a second filter 302. A first signal path 31 is connected to the first filter 301 and a second signal path 32 is connected to the second filter 302. These paths are combined into a common antenna path by means of the frequency-separating filter.

The first signal path 31 is assigned to a first transmission system with a frequency band of approximately 2 GHz. The second signal path 32 is assigned to a second transmission system with a frequency band of approximately 5 GHz.

The signal paths 31, 32 respectively represent a transmission-reception path. The first signal path 31 comprises a first transmitting path 311 and a first receiving path 312. The second signal path 32 comprises a second transmitting path 321 and a second receiving path 322.

A first switch 41 is arranged in the first signal path 31, and switches between the partial paths 311, 312. A second switch 42 is arranged in the second signal path 32 and switches between the partial paths 321, 322. The switches used may consist, e.g., of SPDT (Single-Pole Dual-Throw) switches.

A first power amplifier 61, a first transmission filter 71 and a balun 81 are arranged in the first transmitting path 311. A second power amplifier 62, a second transmission filter 72 and a balun are arranged in the second transmitting path 321. A first low-noise amplifier 51, a first reception filter 73 and a balun are arranged in the first receiving path 312. A second low-noise amplifier 52, a second reception filter 74 and a balun are arranged in the second receiving path 322. Each respective balun is connected between the input of the transmitting path 311, 321 and the transmission filter 71, 72 or between the output of the receiving path 312, 322 and the reception filter 73, 74.

The reception filters 73, 74 make it possible to suppress GSM-, DCS- and PCS signals in the stop band of the receiving paths 312, 322. In the transmitting paths 311, 321, the second and third harmonic components of the transmission frequency of the respective frequency band are suppressed by the diplexer 300.

The filter arranged in the transmitting path may also be realized in the form of a bandpass filter. Alternatively, a high-pass filter may be connected adjacent to a low-pass filter in the transmitting path, wherein these filters jointly realize a bandpass filter. Consequently, interfering signals of the local oscillator can be suppressed.

The combination of the filter and the balun serially connected thereto can be replaced with a balanced filter.

The respective amplifier 51, 52, 61, 62 is arranged between the switch 41, 42 and the filter 71, 72, 73, 74. The switch 41, 42 is arranged between the frequency-separating filter 300 and the amplifier 51, 52, 61, 62. This system architecture, in which the switches and the amplifiers are directly connected to one another, is considered advantageous with respect to a possible integration of the switches and at least a few of the amplifiers into a semiconductor chip 202, 202'.

The utilization of only one diplexer in a dual-band device provides the advantage here that the frequency-separating filter section can be realized in a particularly compact and space-saving way.

The figures indicate that the low-noise amplifiers 51, 52 and the switches 41, 42 are realized in one structural unit, i.e., in a common chip 202. The chip 202 therefore consists of a multi-band LNA. LNA stands for Low-Noise Amplifier. The power amplifiers 61, 62 are realized in another chip 202'. The chip 202' therefore consists of a multi-band PA. PA stands for Power Amplifier.

It would be possible to realize all amplifiers and switches in a single chip.

Figure 2:
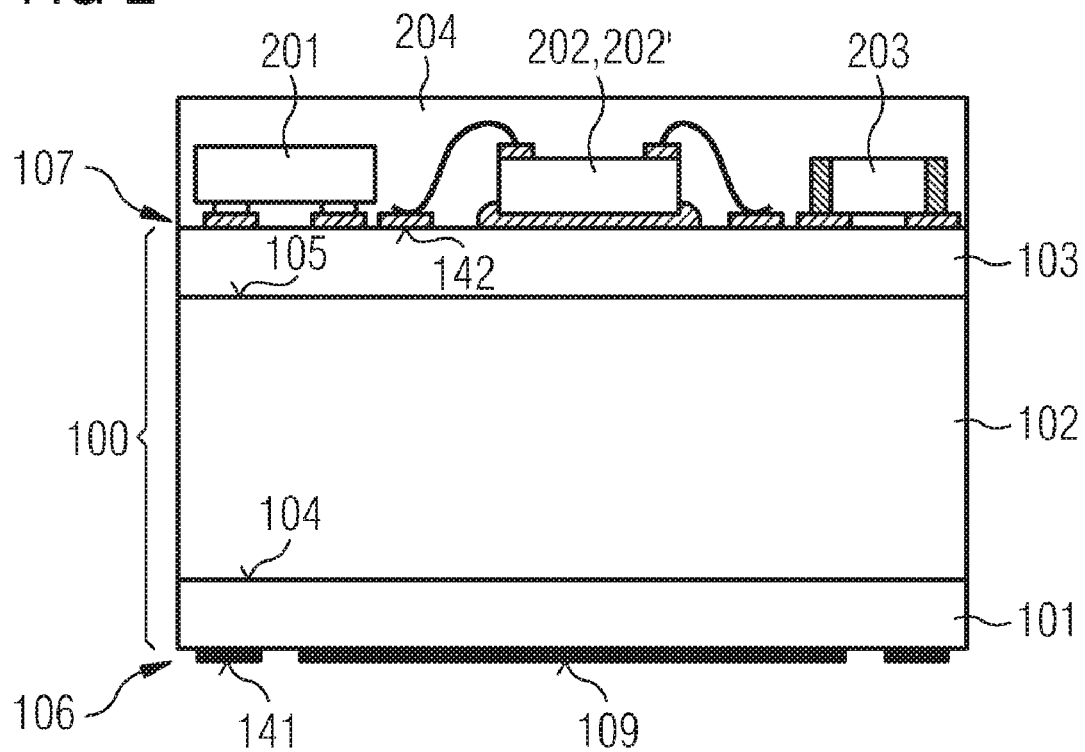
FIG. 2 shows a cross section through the component with a carrier substrate that features two wiring areas with a functional area arranged between them.

The chips 202, 202' are mounted on a carrier substrate 100 and electrically connected thereto as shown in FIG. 2. The carrier substrate 100 and the chips mounted thereon form an electrical component that is conductively connected to a transceiver circuit 90. This circuit is also referred to as a Radiofrequency Integrated Circuit. It is designed for additionally processing reception signals and for generating transmission signals intended for the component. The transceiver circuit 90 typically features balanced electrical terminal pairs that are connected to the balanced electrical terminal pairs of the component. The transceiver circuit 90 may alternatively feature an unbalanced (single-ended) electrical terminal pair on at least one side.

The filters 71-74 are realized in the form of bandpass filters, wherein the transmission filters 71, 72 may also be realized in the form of low-pass filters. At least the transmission filters 71, 72, and optionally the reception filters 73, 74, are integrated into the carrier substrate 100. However, they may also be realized in at least one chip that is mounted on the carrier substrate 100. The baluns 81 are preferably integrated into the carrier substrate 100.

The isolating capacitor 308 may be realized in the form of a chip capacitor that is mounted on the carrier substrate 100. The isolating capacitor 308 may also be integrated into the carrier substrate 100.

The carrier substrate 100 comprises a lower wiring area 101, an upper wiring area 103 and a functional area 102 arranged between them that is isolated or electromagnetically shielded relative to the wiring area 101 by a ground area 104 and relative to the wiring area 103 by another ground area 105.

Figure 3:
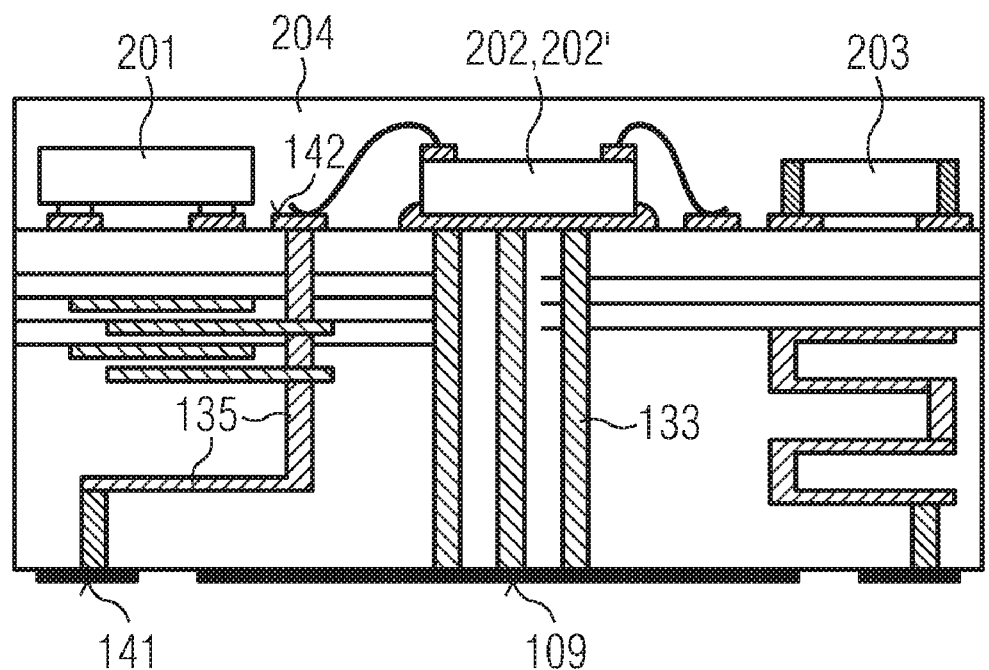
FIG. 3 shows a cross section through an example component with heat dissipation for a semiconductor chip arranged on the carrier substrate.

Terminal areas 141 in the form of external contacts of the component are provided on the underside of the carrier substrate 100. At least one ground area 109 is also arranged in the central region of the underside and serves for dissipating the heat of the semiconductor chip 202, 202', together with the through-platings 133 and the ground areas 152, 152' as shown in FIG. 3. This ground area is preferably thermally coupled to an external printed-circuit board. In the variant according to FIG. 4, two lower ground areas 109 are provided.

Contact areas 142 are provided on the upper side of the carrier substrate 100 and serve for contacting the chips 201, 202, 202', 203.

For example, a filter is realized in the chip 201. A capacitor or a diode is realized, e.g., in the chip 203. The chips 201, 203 are preferably suitable for surface mounting. In the variant according to FIG. 2, the chip 201 is realized in accordance with the flip-chip technology and mounted on the contact areas of the carrier substrate by means of bumps.

The chips 202, 202' are conductively connected to the contact areas 142 by means of bond wires. The chips 202, 202' preferably are tightly connected to the carrier substrate 100 by means of an adhesive. They may be connected to a ground area realized on the upper side of the carrier substrate 100 by means of a conductive adhesive.

All terminal areas 141 and the ground area 109 jointly form a so-called footprint 106. The footprint represents an SMD-compatible interface. The terminal areas 141 are realized in the form of HR contacts, DC contacts and ground contacts. The conductive areas 109 are realized in the form of thermal contacts.

The HR lines of the module are connected to HR contacts, and the supply lines of the semiconductor chip 202, 202' are connected to DC contacts. The supply lines are preferably routed such that they do not influence the HR lines of the module. The minimum distance between DC- and HR lines is preferably two to three times greater than the distance to the closest ground plane. The redistribution in accordance with the layout of the assembly plane 107 and the footprint 106 does not take place before the wiring areas.

All contact areas 142 and, if applicable, the upper ground area 152, 152' that lies underneath the chip 202, 202' jointly form an assembly plane 107. The contact areas 142 are realized in the form of HR contacts, DC contacts and ground contacts for the chips 201, 202, 202', 203. The conductive areas 152, 152' are realized in the form of thermal contacts for the chips 202, 202'.

The wiring area 101 serves for adapting the arrangement of electrical connections of the sections to the footprint 106. The wiring area 103 serves for adapting the arrangement of electrical connections of the sections to the assembly plane 107. Due to the fact that the wiring areas are available for the adaptation of the electrical wiring of the component, the layout of the functional area is not dependent on the layout of the external interfaces of the carrier substrate, i.e., the footprint and the wiring plane. Consequently, the footprint layout of the component can be easily adapted to the layout of a system circuit board, on which the component should be mounted, wherein the layout of the functional area can be preserved.

This also applies to the layout of the assembly plane 107 that can now be flexibly designed without having to change the layout of the functional area by utilizing the wiring area 103.

The chips 201, 202, 202', 203 are encapsulated by means of a sealing compound 204 that ends with the upper side of the carrier substrate outside the base of the chip. The sealing compound 204 preferably contains resin.

Figure 4:
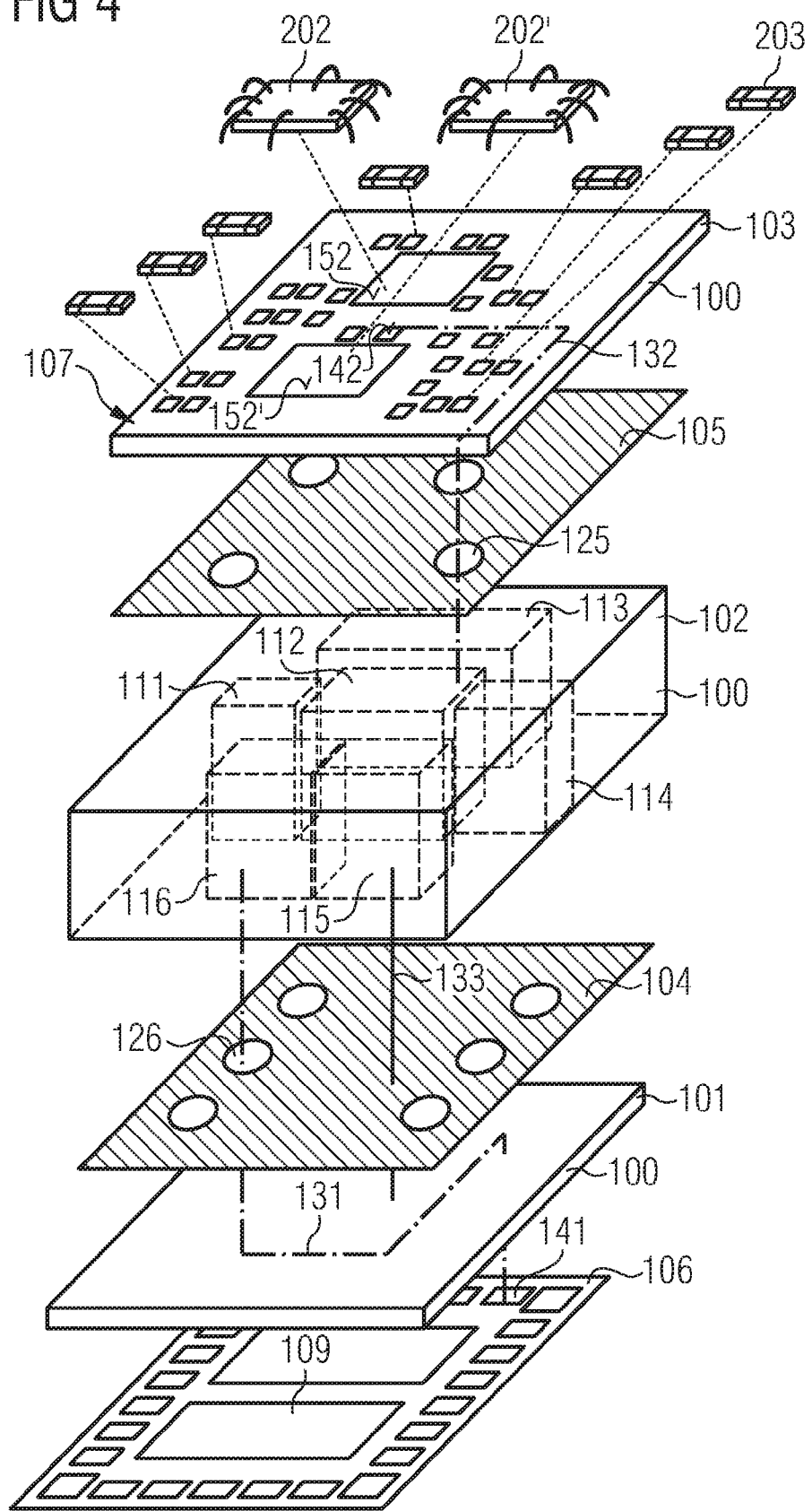
FIG. 4 shows an exploded 3-D view of the internal structure of the carrier substrate.

The functional area 102 of the carrier substrate 100 is partitioned, as indicated by the broken lines in FIG. 4, in order to form separate sections 111-116.

The frequency-separating filter 300 is realized in the section 113. In one variant, a directional coupler, another reception filter and/or another transmission filter may be additionally realized in the section. In contrast to the filters 71-74, these filters are preferably arranged between the frequency-separating filter 300 and the respective amplifier 51, 52, 61, 62.

The balanced filter for the first frequency band, i.e., 2 GHz, is respectively realized in the sections 115, 116. A balanced filter for the second frequency band, i.e., 5 GHz, is respectively realized in the sections 111, 114.

Each balanced filter comprises the filter 71, 73 and the balun 81 connected thereto.

The section 112 represents an amplifier section that comprises the heat dissipation for the chips 202, 202' and a shield. Due to the proposed wiring areas 101, 103, the remaining sections can be arranged in space-saving fashion adjacent to the section 112, although the inputs and outputs of these sections are arranged in an edge region of the carrier substrate 100.

Recesses 125 for leading through signal-carrying connecting lines 132 are realized in the ground area 105. Recesses 126 for leading through signal-carrying connecting lines 131 are analogously realized in the ground area 104. The through-platings 133 provided for dissipating the heat of the semiconductor chip are preferably connected to these ground areas.

The through-platings 133 provided for dissipating the heat of the semiconductor chip can be distinguished from other grounded through-platings in that they are arranged directly adjacent to one another, wherein the distance between the centers of the through-platings 133 is no greater than three times their diameter.

Figure 5:
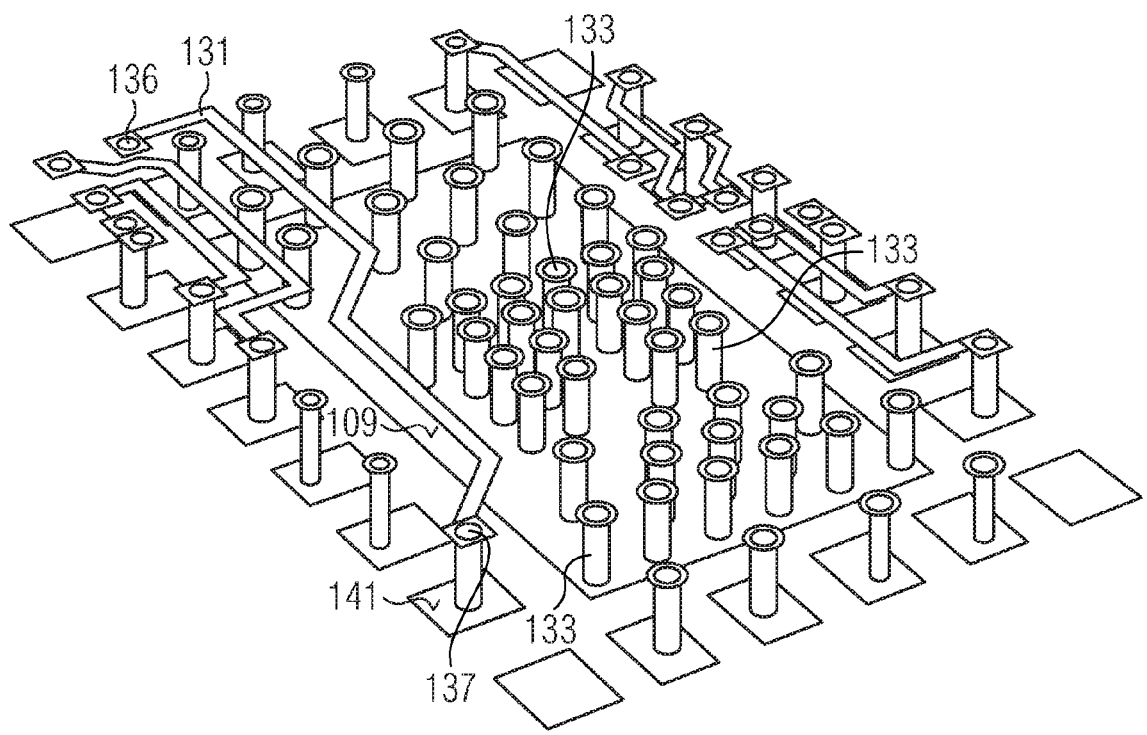
FIG. 5 shows a perspective representation of the lower wiring area and the footprint plane of the component.

FIG. 5 shows an example of redistribution of the electrical connections of the module. The connecting line 131 conductively connects the contact 136 to a contact 137. The contact 136 is arranged directly underneath the filter input or output and conductively connected thereto by means of a vertical electrical connection. The contact 137 is arranged directly above the terminal area 141 and conductively connected thereto by means of a vertical electrical connection.

Referring to FIGS. 4 and 5, the respective wiring area 101, 103 comprises at least one metallization plane in which the connecting lines are realized. The respective connecting line 131, 132 conductively connects a certain section to the contact area 142 or the terminal area 141.

The footprint 106 is assigned to the wiring area 101. The assembly plane 107 is assigned to the wiring area 103. The wiring area 101 represents an electrical connection between the footprint 106 and the functional area 102. The wiring area 103 represents an electrical connection between the assembly plane 107 and the functional area 102. The wiring area 101, 103 preferably comprises at least one internal metallization plane of the substrate. The wiring area may also feature several metallization planes, e.g., if different connecting lines extend partially one on top of the other or if a crossover is required.

Even if the shortest electrical connections possible are preferred, it is advantageous if a section of a connecting line extends beyond the base of the section connected thereto in the respective wiring area, namely up to a location that corresponds to the position of the terminal area or the contact area in the lateral plane.

The characteristics of the component that are illustrated in the figures and were elucidated in connection with the described embodiments are not restricted to these embodiments, but rather can be arbitrarily combined.

The ground areas, particularly the lower ground area 109, may respectively feature several segments that are preferably realized continuously and conductively interconnected by means of a bridge-like connection or in some other way.

It would be possible, in principle, to realize the disclosed component and the transceiver circuit 90 as one structural unit, i.e., in the form of one chip.

What is claimed is:

1. An electrical component comprising:
   a multilayer carrier substrate;
   at least one semiconductor chip mounted on the carrier substrate;
   terminal areas of the component arranged on an underside of the carrier substrate; and
   contact areas arranged on an upper side of the carrier substrate, with at least two of the contact areas being assembled with the at least one semiconductor chip,
   wherein the carrier substrate features a functional area with a plurality of sections, with at least one of the following functions being assigned to each section: balun, frequency-separating filter, filter or heat dissipation for the at least one semiconductor chip, wherein each of the plurality of sections are assigned to different ones of the functions,
   wherein at least one of the sections does not overlap other sections of the plurality of sections in a plan view,
   wherein the plurality of sections include a first section that is conductively connected to contact areas and/or terminal areas that lie outside a base of the first section in a plan view,
   wherein the carrier substrate features an upper wiring area and a lower wiring area, the functional area being arranged between the upper wiring area and the lower wiring area,
   wherein the upper wiring area features first connecting lines that elecrically conductively connect the the respective sections to the contact areas,
   wherein the lower wiring area features second connecting lines that electrically conductively connect the the respective sections to the terminal areas, and
   wherein the functional area of the carrier substrate is shielded from the upper and lower wiring areas by means of one ground area that extends over at least two of the sections in a plan view.

2. The component according to claim 1, wherein the at least one semiconductor chip comprises at least one amplifier and at least one semiconductor switch.

3. The component according to claim 2, further comprising:
   a first signal path comprising a first transmitting path and a first receiving path assigned to a first transmission system;
   a second signal path comprising a second transmitting path and a second receiving path assigned to a second transmission system;
   wherein a frequency-separating filter is provided for separating signals of the first and second transmission systems.

4. The component according to claim 3,
   wherein the at least one amplifier comprises a first low-noise amplifier that is arranged in the first receiving path and a second low-noise receiver that is arranged in the second receiving path, and
   wherein the at least one amplifier comprises a first power amplifier that is arranged in the first transmitting path and a second power amplifier that is arranged in the second transmitting path.

5. The component according to claim 4,
   wherein a first switch is arranged in the first signal path and alternately connects the first transmitting path and the first receiving path to a common first transmission-reception path, and
   wherein a second switch is arranged in the second signal path and alternately connects the second transmitting path and the second receiving path to a common second transmission-reception path.

6. The component according to claim 5,
   wherein the first signal path and the second signal path are connected to the frequency-separating filter, and
   wherein the frequency-separating filter is arranged between an antenna and the first and second signal paths.

7. The component according to claim 6, wherein the frequency-separating filter is arranged between the antenna and the switches.

8. The component according to claim 5,
   wherein the first switch is connected between the frequency-separating filter and the first low-noise amplifier,
   wherein the first switch is connected between the frequency-separating filter and the first power amplifier,
   wherein the second switch is arranged between the frequency-separating filter and the second low-noise amplifier, and
   wherein the second switch is arranged between the frequency-separating filter (300) and the second power amplifier.

9. The component according to claim 5, wherein the at least one semiconductor chip comprises the switches, as well as at least two of the amplifiers.

10. The component according to claim 9, wherein the switches and low-noise amplifiers of two signal paths are realized in a common first chip.

11. The component according to claim 10, wherein power amplifiers of the two signal paths are realized in a common second chip.

12. The component according to claim 9, wherein the switches and power amplifiers of two signal paths are realized in a common first chip.

13. The component according to claim 3,
wherein the frequency-separating filter comprises a first bandpass filter, a passband of which comprises a frequency band of the first transmission system, with a frequency band of the second transmission system lying in a stop band of the first bandpass filter, and
wherein the frequency-separating filter comprises a second bandpass filter, a passband of which comprises a frequency band of the second transmission system, with the frequency band of the first transmission system lying in a stop band of the second bandpass filter.

14. The component according to claim 2, wherein the at least one amplifier is connected between a respective switch and a filter.

15. The component according to claim 1, wherein the contact areas and/or the terminal areas are conductively connected to the respective section by means of a connecting line that is shielded from the respective section by a ground area.

16. The component according to claim 15, wherein the ground area extends over all sections.

17. The component according to claim 1, wherein at least one of the first and/or second connecting lines extends beyond the base of the section connected thereto.

18. The component according to claim 1, wherein an insulation zone with a minimum width of 100 μm is arranged between at least two of the sections.

19. The component according to claim 18, wherein the insulation zone has a maximum width of 300 μm.

20. The component according to claim 1, wherein at least two of the sections are electrically connected to one another by a connecting line with a maximum length of 500 μm.

21. The component according to claim 1, wherein the at least one semiconductor chip comprises a detector diode and/or a directional coupler.

* * * * *